US007030393B2

(12) United States Patent
Loda et al.

(10) Patent No.: US 7,030,393 B2
(45) Date of Patent: Apr. 18, 2006

(54) COMPACT SELF-SHIELDED IRRADIATION SYSTEM AND METHOD

(75) Inventors: Gary K. Loda, Pleasanton, CA (US); Carl B. Eichenberger, Moraga, CA (US)

(73) Assignee: The Titan Corporation, San Diego, CA (US)

(*) Notice: Subject to any disclaimer, the term of this patent is extended or adjusted under 35 U.S.C. 154(b) by 0 days.

(21) Appl. No.: 10/968,580

(22) Filed: Oct. 18, 2004

(65) Prior Publication Data

US 2005/0230640 A1 Oct. 20, 2005

Related U.S. Application Data

(62) Division of application No. 10/431,194, filed on May 6, 2003, now Pat. No. 6,815,691.

(51) Int. Cl.
*H01J 37/20* (2006.01)

(52) U.S. Cl. ........................... 250/455.11; 250/453.11; 378/64

(58) Field of Classification Search ............ 250/455.11
See application file for complete search history.

(56) References Cited

U.S. PATENT DOCUMENTS 5,225,884 A 7/1993 Stark et al.
6,690,020 B1 2/2004 Loda

*Primary Examiner*—Nikita Wells
*Assistant Examiner*—Phillip A. Johnston
(74) *Attorney, Agent, or Firm*—Peter K. Hahn; Luce, Foward, Hamilton & Scripps

(57) ABSTRACT

A carousel and first and second members have common axes in a first direction. The carousel, preferably cylindrical, has a ring-shaped configuration defined by inner and outer diameters. The first member has an outer diameter preferably contiguous to the carousel inner diameter. The second member has an inner diameter preferably contiguous to the carousel outer diameter. The carousel is divided into compartments by vanes. The carousel rotates at a substantially constant speed past radiation directed by an accelerator in the first direction. When a fault occurs in the system operation, (1) the carousel and radiation stop and (2) the carousel reverses in direction. When the fault is resolved, the carousel moves in the forward direction at the substantially constant speed and the radiation resumes at the position where the article was being irradiated at the time that the fault occurred. Each article is transferred from a first conveyor into one of the compartments from a position above the compartment and, after being irradiated, is transferred to a second conveyor from the position above the compartment. A cover at the top of the compartment normally covers the compartment. The cover becomes opened to provide for the article transfer into the compartment, remains open during the article irradiation in the compartment and becomes closed after the article transfer to the second conveyor. The leading edge of the article in the compartment is determined to facilitate the article transfer from the compartment after the article irradiation.

11 Claims, 11 Drawing Sheets

PRIOR-ART

PRIOR-ART

PRIOR-ART

COMPACT SELF-SHIELDED IRRADIATION SYSTEM AND METHOD

CROSS REFERENCE TO RELATED APPLICATIONS

This application is a divisional of U.S. patent application Ser. No. 10/431,194, filed on May 6, 2003, Now U.S. Pat. No. 6,815,691 the contents of which are incorporated herein by reference.

FIELD OF THE INVENTION

This invention relates to systems for, and methods of, irradiating products, including food products to make them safe to use or eat. More particularly, the invention relates to systems for, and methods of, providing a simplified arrangement in a minimal space and at a minimal cost without any significant sacrifice in the quality of the irradiation provided to the products including food products.

BACKGROUND OF A PREFERRED EMBODIMENT OF THE INVENTION

It has been known for some time that drugs and medical instruments and implements have to be irradiated so that they will not cause patients to become ill from harmful bacteria when they are applied to the patients. Systems have accordingly been provided for irradiating drugs and medical instruments and implements. The drugs and the medical instruments and implements have then been stored in sterilized packages until they have been ready to be used.

In recent years, it has been discovered that foods can carry harmful bacteria if they are not processed properly or, even if they are processed properly, that the foods can harbor and foster the proliferation of such harmful bacteria if they are not stored properly or retained under proper environmental conditions such as temperature. Some of the harmful bacteria can even be deadly.

For example, harmful bacteria have been discovered in recent years in hamburgers prepared by one of the large hamburger chains. Such harmful bacteria have caused a number of purchasers of hamburgers at stores in the chain to become sick. As a result of this incident and several other similar incidents, it is now recommended that hamburgers should be cooked to a well done, or at least a medium, state rather than a medium rare or rare state. Similarly, harmful bacteria have been found to exist in many chickens that are sold to the public. As a result of a number of incidents which have recently occurred, it is now recommended that all chickens should be cooked until no blood is visible in the cooked chickens.

To prevent incidents such as discussed in the previous paragraphs from occurring, various industries have now started to irradiate foods before the foods are sold to the public. This is true, for example, of hamburgers and chickens. It is also true of fruits, particularly fruits which are imported into the United States from foreign countries.

In previous years, gamma rays have generally been the preferred medium for irradiating various articles. The gamma rays have been obtained from a suitable material such as cobalt and have been directed to the articles to be irradiated. The use of gamma rays has had certain disadvantages. One disadvantage is that irradiation by gamma rays is slow. Another disadvantage is that irradiation by gamma rays is not precise. This results in part from the fact that the strength of the source (e.g. cobalt) of the gamma rays decreases over a period of time and that the gamma rays cannot be directed in a sharp beam to the articles to be irradiated. This prevents all of the gamma rays from being useful in irradiating the articles.

In recent years, electron beams have been directed to articles to irradiate the articles. Electron beams have certain advantages over the use of gamma rays to irradiate articles. One advantage is that irradiation by electron beams is fast. For example, a hamburger patty having a square cross section can be instantaneously irradiated by a passage of an electron beam of a particular intensity through the hamburger patty. Another advantage is that irradiation by an electron beam is relatively precise because the strength of the electron beam remains substantially constant even when the electron beam continues to be generated over a long period of time.

X-rays have also been used to irradiate articles. The x-rays may be formed from electron beams. An advantage in irradiating articles with x-rays is that the articles can be relatively thick. For example, x-rays can irradiate articles which are thicker than the articles which are irradiated by electron beams. A disadvantage is that the x-ray cannot be focused in a sharply defined beam.

The systems now in use are relatively complicated and relatively expensive and occupy a considerable amount of space. These systems are particularly effective when used at companies requiring radiation of large volumes of products at a particular location. These companies are generally large and have considerable assets. No system apparently exists for irradiating reduced volumes of products at a particular location. No system apparently exists for use by companies of small or medium size.

In co-pending application Ser. No. 09/971,986 a system and method are disclosed and claimed for irradiating articles in a minimal space, and at a minimal cost, without any significant sacrifice in the quality of the radiation of the articles compared to the irradiation provided in the prior art. The invention disclosed and claimed in the co-pending application is particularly effective for use by companies of small or medium size or where the irradiation of products is only sporadic.

In co-pending application Ser. No. 09/971,986 , an accelerator provides radiant energy in a first direction. A carousel and first and second members have a common axis in the first direction. The carousel, preferably cylindrical, has a ring-shaped configuration defined by inner and outer diameters. The first member has an outer diameter preferably contiguous to the inner diameter of the carousel. The second member has an inner diameter preferably contiguous to the outer diameter of the carousel. The first and second members provide shielding against the radiant energy from the accelerator.

A single motor (e.g., a stepping member) rotates the carousel past the radiant energy in co-pending application Ser. No. 09/971,986 continuously at a substantially constant speed in successive revolutions. Vanes made from a shielding material are disposed at spaced positions in the carousel to divide the carousel into compartments for receiving the articles and to isolate each compartment against the radiant energy in other compartments.

A loader in co-pending application Ser. No. 09/971,986 loads the articles into compartments before the movement of the articles in the compartments past the radiant energy. An unloader in the co-pending application Ser. No. 09/971,986 unloads the articles from the compartments after the movement of the articles in the compartments past the radiant energy.

Each article is transferred from a first conveyor into one of the compartments from a position above the compartment and, after being irradiated, is transferred to a second conveyor from the position above the compartment. A cover at the top of the compartment normally covers the compartment. The cover becomes opened to provide for the article transfer into the compartment, remains open during the article irradiation in the compartment and becomes closed after the article transfer to the second conveyor. The leading edge of the article in the compartment is determined to facilitate the article transfer from the compartment.

BRIEF DESCRIPTION OF A PREFERRED EMBODIMENT OF THE INVENTION

A carousel and first and second members have common axes in a first direction. The carousel, preferably cylindrical, has a ring-shaped configuration defined by inner and outer diameters. The first member has an outer diameter preferably contiguous to the carousel inner diameter. The second member has an inner diameter preferably contiguous to the carousel outer diameter.

The carousel is divided into compartments by vanes. The carousel is divided into compartments by vanes. The carousel rotates at a substantially constant speed past radiation directed by an accelerator in the first direction. When a fault occurs in the system operation, the carousel and radiation stop and the carousel reverses in direction. When the fault is resolved, the carousel moves in the forward direction at the substantially constant speed and the radiation resumes at the position where the article was being irradiated at the time that the fault occurred.

DETAILED DESCRIPTION OF A PREFERRED EMBODIMENT OF THE INVENTION

Figure 1:
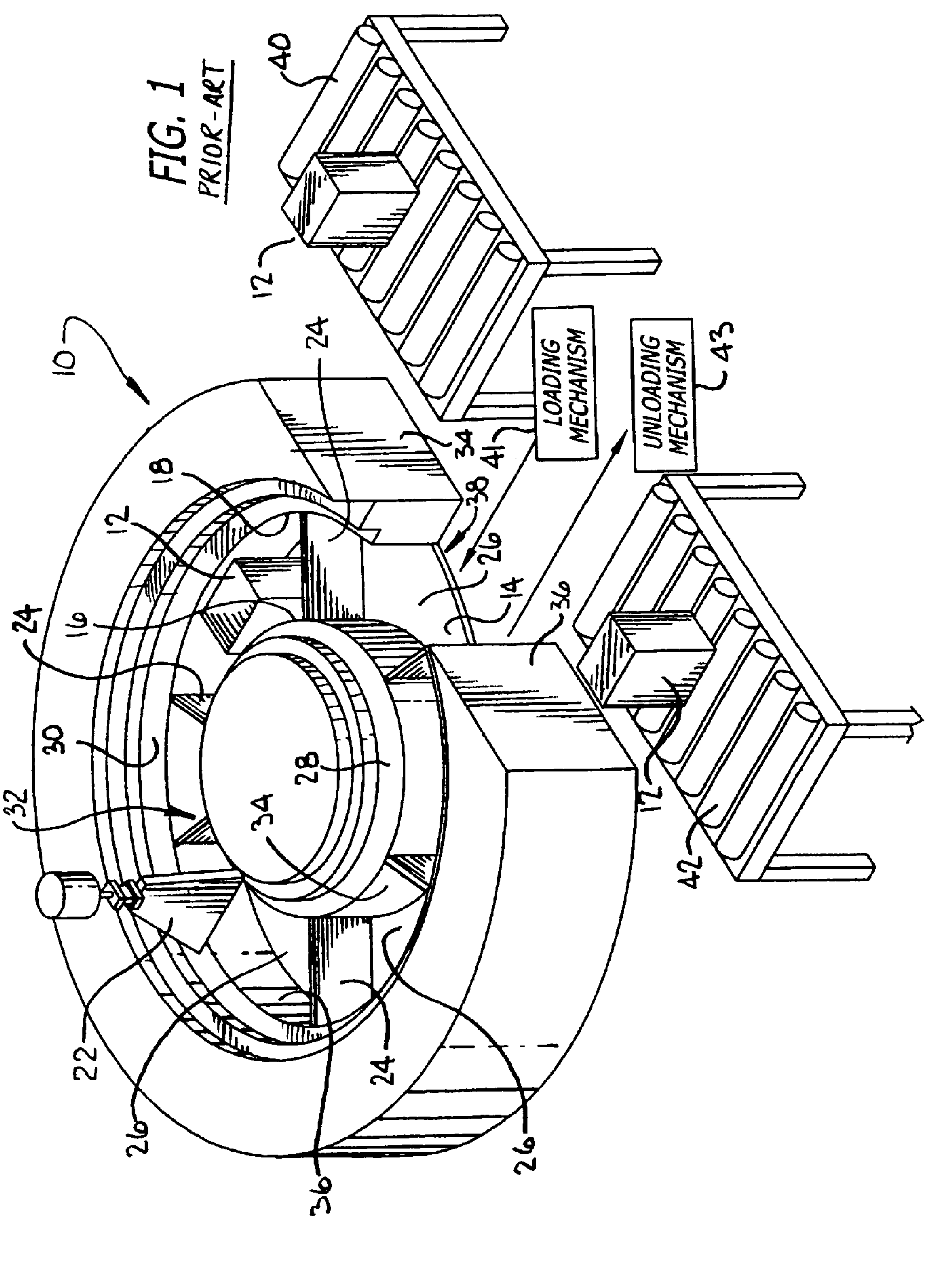
FIG. 1 is a perspective view, as seen from a position above the apparatus, of a preferred embodiment of a system disclosed and claimed in co-pending application Ser. No. 09/971,986 for irradiating articles, the preferred embodiment including a rotary carousel, compartments in the carousel and articles in the compartments.
Figure 3:
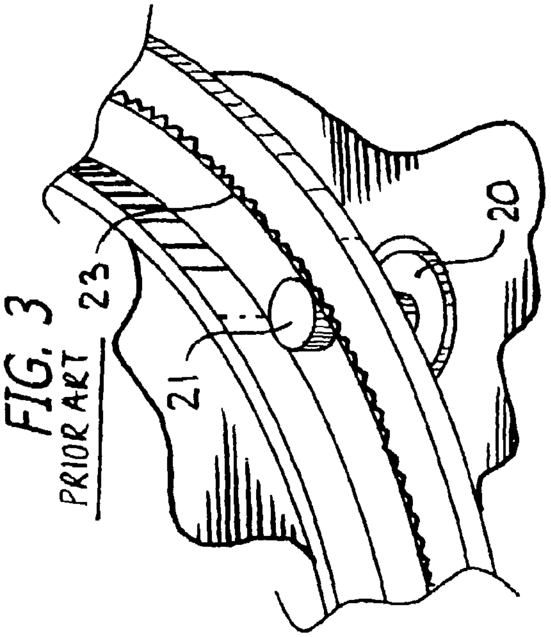
FIG. 3 PRIOR ART
FIG. 3 is a fragmentary perspective view of the carousel shown in FIGS. 1 and 2 and of a stepping motor arrangement for rotating the carousel at a substantially constant speed.

A system generally indicated at 10 and shown in FIGS. 1–4 is disclosed and claimed in co-pending application Ser. No. 09/971,986 assigned of record to the assignee of record of this application. The system shown in FIGS. 1–4 is designated as prior art because it is disclosed in co-pending application Ser. No. 09/971,986 . The system is provided for irradiating articles 12. The radiation may be provided by gamma rays, electron beams or x-rays, although electron beams are generally preferred. The articles 12 may be drugs, medical instruments and medical products which are irradiated so that they will not cause patients to become ill from harmful bacteria when they are applied to the patients. The articles 12 may also be different food articles such as meat, poultry, vegetables and fruit, particularly those imported from foreign countries.

The system 10 includes a carousel 14. The carousel 14 has a ring shape, preferably cylindrical, defined by an axis of rotation and by an inner diameter 16 and an outer diameter 18. The inner and outer diameter 16 and 18 of the carousel 14 are coaxial with the carousel axis of rotation. The carousel is rotatable as by a motor 20, preferably at a substantially constant speed. The motor 20 may be a stepping motor which drives a pinion gear 21 along a rack gear 23 provided in the carousel 14. The rotary movement of the carousel 14 is past radiation from a source or accelerator 22. The radiation from the source or accelerator 22 is in a direction corresponding to the axis of rotation of the carousel 14.

In the system disclosed and claimed in co-pending application Ser. No. 09/971,986 , vanes 24 are disposed in the carousel 14, preferably at spaced intervals in the annular direction around the carousel. The vanes 24 divide the carousel 14 into compartments 26 for receiving the articles 12. The vanes 24 may be made from a suitable material such as a steel or other metal having properties of providing radiation shielding to prevent radiation in one compartment from entering into other compartments. The vanes 24 extend within the carousel 14 between the inner diameter 16 and the outer diameter 18 of the carousel. The vanes 20 particularly provide shielding in each compartment 26 against x-rays.

A radiation shielding member 28 is disposed within the inner diameter 16 of the carousel 14. The shielding member 28 is stationary and preferably cylindrical and is provided with the same axis as the carousel 14. The radiation shielding member 28 is preferably made from a suitable material such as concrete.

A radiation shielding member 30 is provided with a hole 32, preferably cylindrical and preferably having an axis corresponding to the axis of rotation of the carousel 14. Preferably the shielding member 30 is contiguous to the outer diameter 18 of the carousel 14. The shielding member 30 may be made from a suitable material such as steel or any suitable metal or from concrete or from a combination of steel and concrete.

Walls 34 and 36 in the system disclosed and claimed in co-pending application Ser. No. 09/971,986 define an opening 38 in the shielding member 30. Preferably the walls 34 and 36 are separated from each other to provide the opening 38 with an angle of approximately 45 degrees. A loading area 40 is provided adjacent the wall 34 to provide for the loading of the articles 12 on the carousel 14. Mechanisms 41 well known in the art may be provided for loading the articles 12 into the compartments 26 from the loading area 40. An unloading area 42 is provided adjacent the wall 36 to provide for the unloading of the articles 12 from the carousel 14 after the articles have been irradiated by the source or accelerator 22. Mechanisms 43 well known in the art may be provided for unloading the articles 12 from the compartments 26 into the unloading area 42.

The articles 12 are loaded into the compartments 26 at the loading area 40 while the carousel 14 is moved at a substantially constant speed by the stepping member 20. The articles 12 then move at the substantially constant speed past the radiation from the source or accelerator 22. This causes progressive positions in the articles 12 to be irradiated with a substantially constant dosage of radiation. After being irradiated, the articles 12 move at the substantially constant speed to the unloading area 42 where the articles are unloaded from the carousel 14.

The articles 12 may have irregular shapes. This causes the radiation dosage at progressive positions in the articles 12 to vary dependent upon the thickness of the articles at these positions. Application Ser. No. 09/971,986 assigned of record to the assignee of record of this application discloses a system for providing fixtures complementary to the irregular configuration of the articles at the progressive position. These fixtures cause the radiation dosage of the articles at progressive positions in the articles to be substantially constant, within acceptable limits, even with irregularities in the configuration of the articles at the progressive positions.

The system 10 disclosed above and also disclosed and claimed in co-pending application Ser. No. 09/971,986 irradiates the articles 12 from only one side of the articles. If it is desired to irradiate the articles 12 from two (2) opposite sides of the articles, the articles may be rotated through an angle of 180 degrees to expose the second side of the articles to radiation from the source or accelerator 22. Alternatively, a second source or accelerator may be disposed on the opposite side of the articles from the source or accelerator 22 to irradiate the second side of the articles. These arrangements are well known in the art.

The system and method described above and disclosed and claimed in co-pending application Ser. No. 09/971,986 have certain important advantages over the prior art. For example, the manufacturing cost and the floor space required by the system is considerably less than is presently being provided. This difference may be by as much as a factor of four (4). Furthermore, the system and method of this invention extend the market to customers who cannot afford the systems now being furnished and offered in the market. Novel and patentable features of this invention include the closed loop ring-shaped carousel, the single motor for driving the carousel at a substantially constant speed, the radiation shielding within the carousel and outside of the carousel and the vanes for dividing the carousel into compartments and for shielding the articles in the compartments against extraneous radiation, particularly x-rays.

Figure 5:
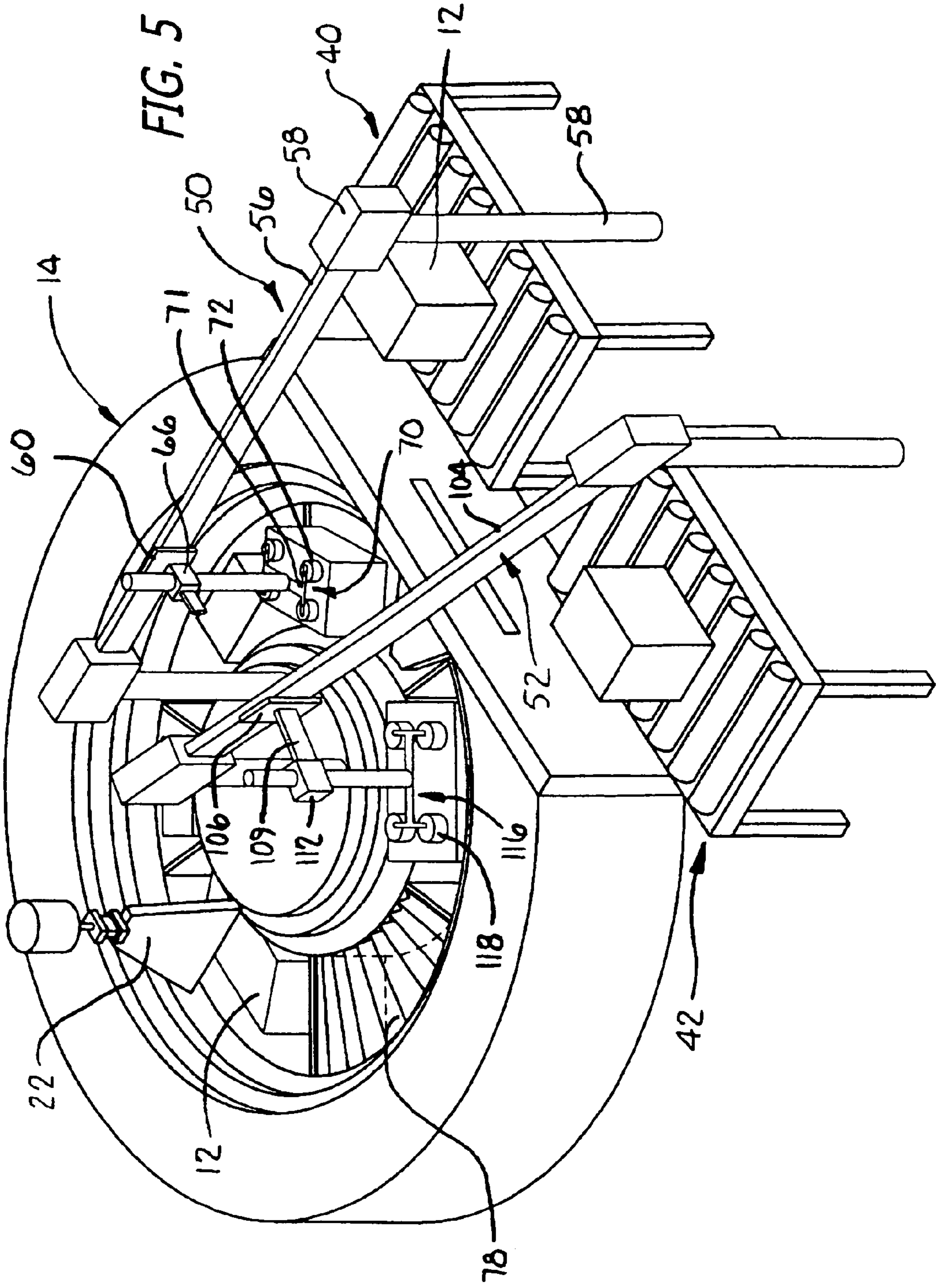
FIG. 5 is a perspective view of apparatus constituting a preferred embodiment of the invention, as seen from a position above the apparatus, the apparatus including a carousel and members for loading articles into the carousel from a first conveyor before the irradiation of the articles and for unloading articles from the carousel into a second conveyor after the irradiation of the articles and FIG. 5 additionally shows a shutter in a closed position on one of the carousel compartments and other shutters in open positions on others of the compartments.
Figure 6:
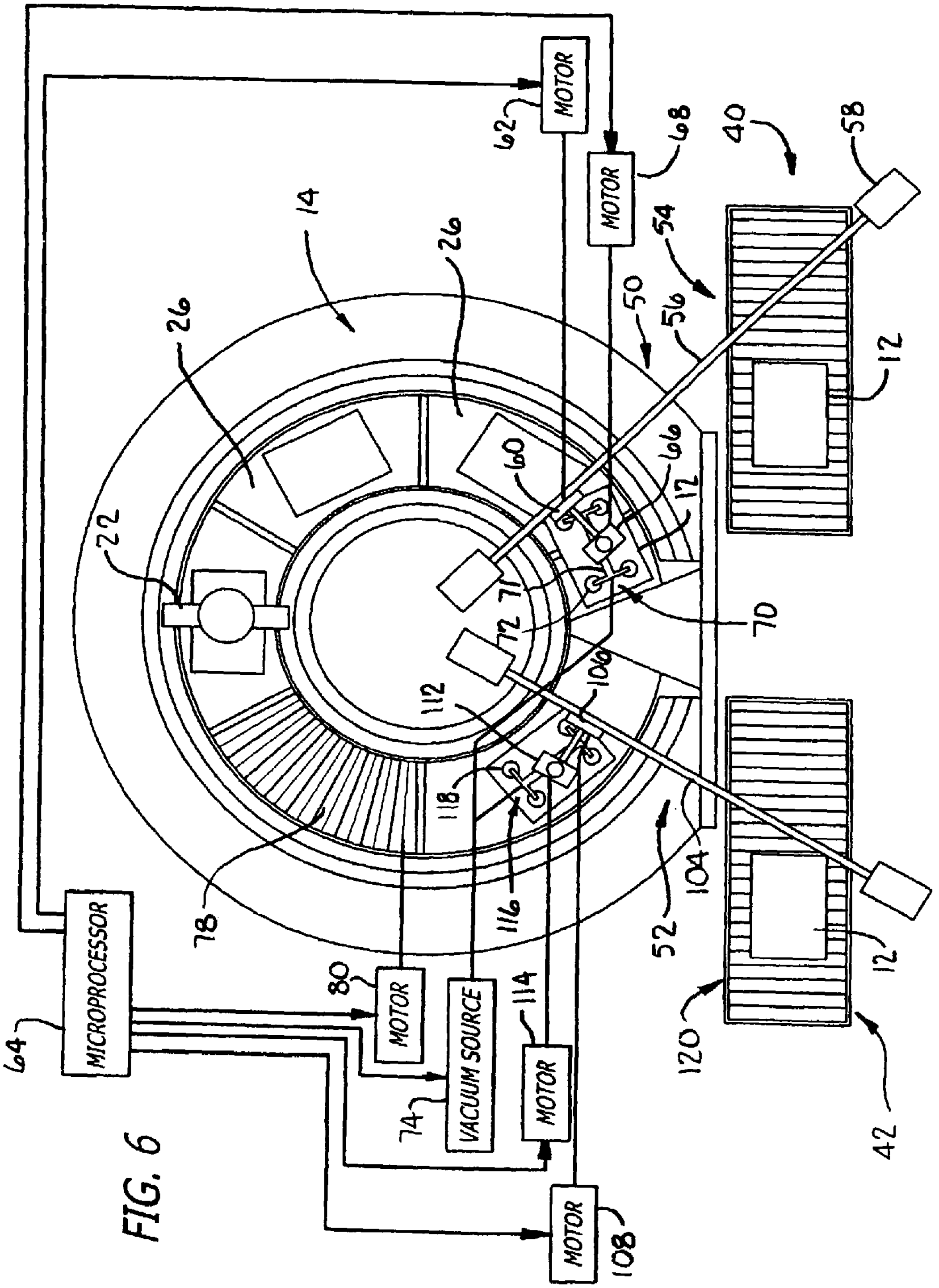
FIG. 6 is a top plan view of the apparatus shown in FIG. 5.

FIGS. 5 and 6 show an improvement in the system of FIGS. 1–4. The improvement shown in FIGS. 5 and 6 constitutes one of the features of this invention. It includes a transfer mechanism, generally indicated at 50, for loading the articles 12 into the carousel 14 from the loading area 40 and a transfer mechanism, generally indicated at 52, for unloading the articles from the carousel 14 and transferring the documents to the unloading area 42. A conveyor generally indicated at 54 (FIG. 6) may be provided for transferring the articles 12 from the loading area 40 to the carousel 14.

The transfer mechanism 50 includes a beam 56 which extends from a support 58 adjacent the conveyor 54. A translator 60 is disposed on the beam 56 for movement in opposite directions along the beam in accordance with the operation of a motor 62. The operation of the motor 62 is controlled by a microprocessor 64.

A translator 66 is suitably coupled to the translator 60 for movement upwardly or downwardly on the translator 60 in accordance with the operation of a motor 68. The translator 66 is transverse, preferably perpendicular, to the movement of the translator 60. The operation of the motor 68 is controlled by the microprocessor 64. A gripping mechanism generally indicated at 71 is supported on the translator 66. The gripping member 70 includes a block 72 on which a plurality of vacuum or suction cups 72 are disposed. A vacuum is applied by a vacuum source 74 to the vacuum ducts 72 to provide a gripping action by the cups on one of the articles 12.

The translator 60 is initially disposed so that the suction cups 72 are disposed adjacent the conveyor 54. A vacuum is applied to the suction cups 72 to provide a gripping action on the article 12 on the conveyor 54. The translator 60 is then driven by the motor 62 along the beam 56 to a position where the cups 72 are disposed above one of the compartments 26 in the carousel 14. This movement is controlled by the microprocessor 64. The vacuum cups 72 are then moved downwardly by the translator 66 to a position where the article 12 is disposed on the floor of the compartment 26. The vacuum in the cups 72 is then released to provide for a separation of the vacuum cups from the article 12 and the vacuum cups are moved upwardly by the translator 66 to a position above the top of the carousel 14. The translator 60 is then moved to the right along the beam 56 until the vacuum cups are disposed adjacent the next one of the articles 12 on the conveyor 54.

Figure 2:
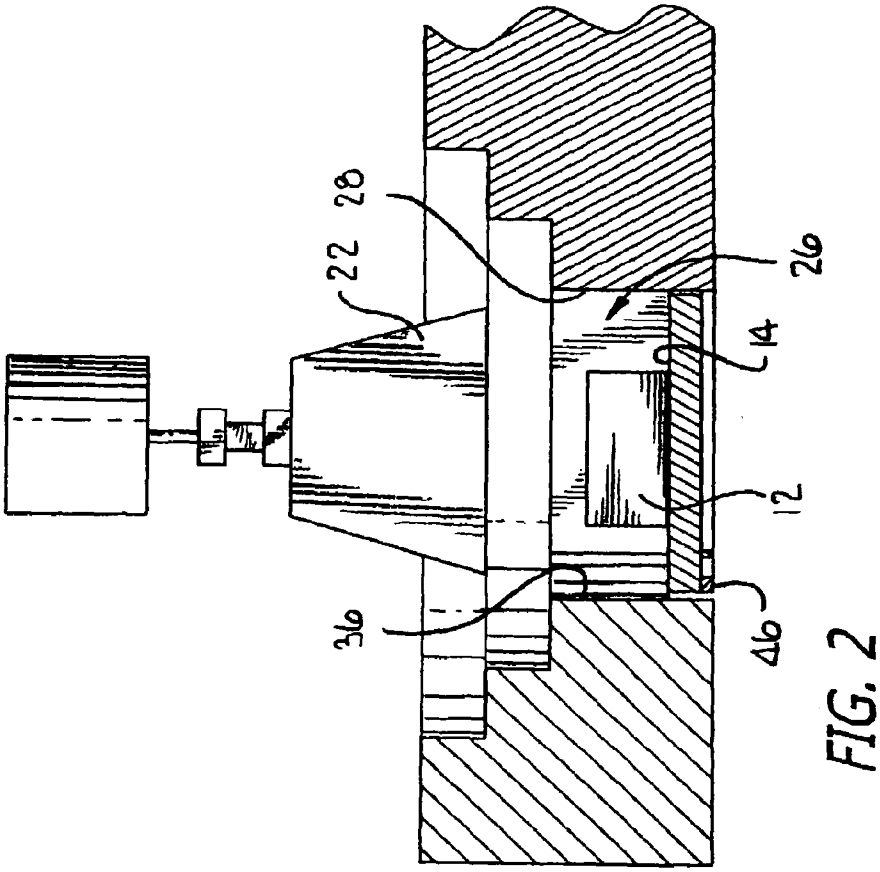
FIG. 2 is a fragmentary sectional view of the carousel, the compartments and the articles shown in FIG. 1 and of an accelerator for irradiating the articles in the compartments.
Figure 4:
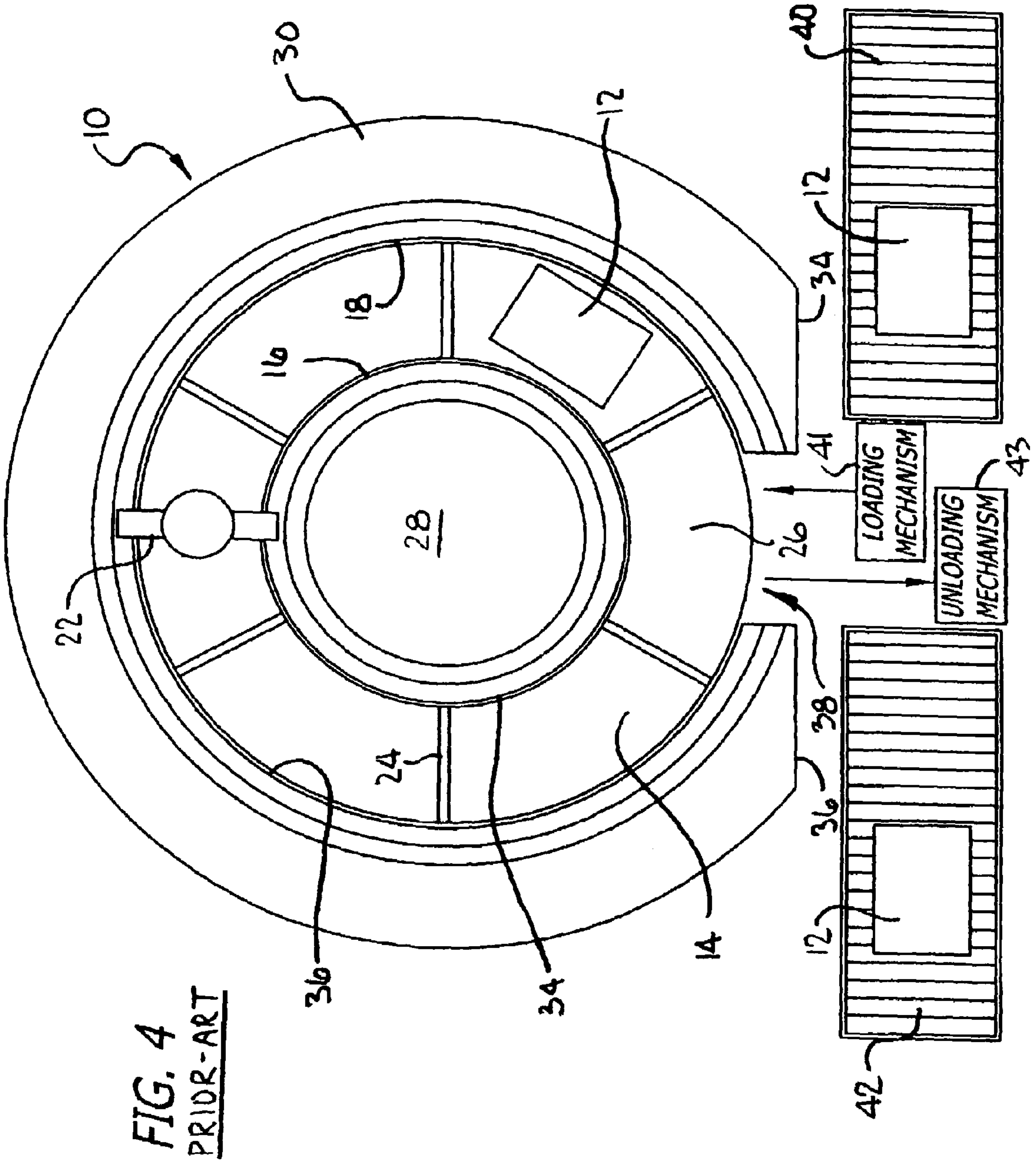
FIG. 4 is a top plan view of the embodiment shown in FIGS. 1-3 for irradiating articles.

As shown in FIGS. 1, 2 and 5, the accelerator 22 is disposed above the articles 12 on the carousel 14. A plurality of closure members generally indicated at 78 (FIG. 6) are disposed at or near the top of the carousel 14. Each of the closure members 78 is associated with an individual one of the compartment 26 to open the compartment to receive the radiant energy from the accelerator 22 in one operative relationship of the closure member and, in a second operative relationship, to close the compartment 26 against the passage of the radiant energy into the compartment. The closure member 78 may be in the form of a bellows having collapsed and expanded relationships. In the collapsed relationship of the bellows, the compartment 26 is open to receive the radiant energy from the accelerator 22. In the expanded relationship of the bellows, the compartment 26 is closed to prevent the passage of the radiant energy into the compartment. The closure member 78 may be made from a suitable material with resilient and radiation shielding properties. For example, the closure member may be made from a resilient steel.

The closure member 78 is normally in the closed relationship to prevent radiant energy from entering the associated compartment 26 when there is no article 12 in the compartment. When the article 12 on the conveyor 54 is transferred to an individual one of the compartments 26, the closure member is compressed by a motor 80 to open the compartment. This may preferably occur while the transfer mechanism 50 is moving the article 12 from the conveyor 54 to the individual one of the compartments 26. As will be appreciated, the transfer of the article 12 to the individual one of the compartments 26 occurs before the article in the compartment reaches the radiant energy from the accelerator 22.

Figure 12:
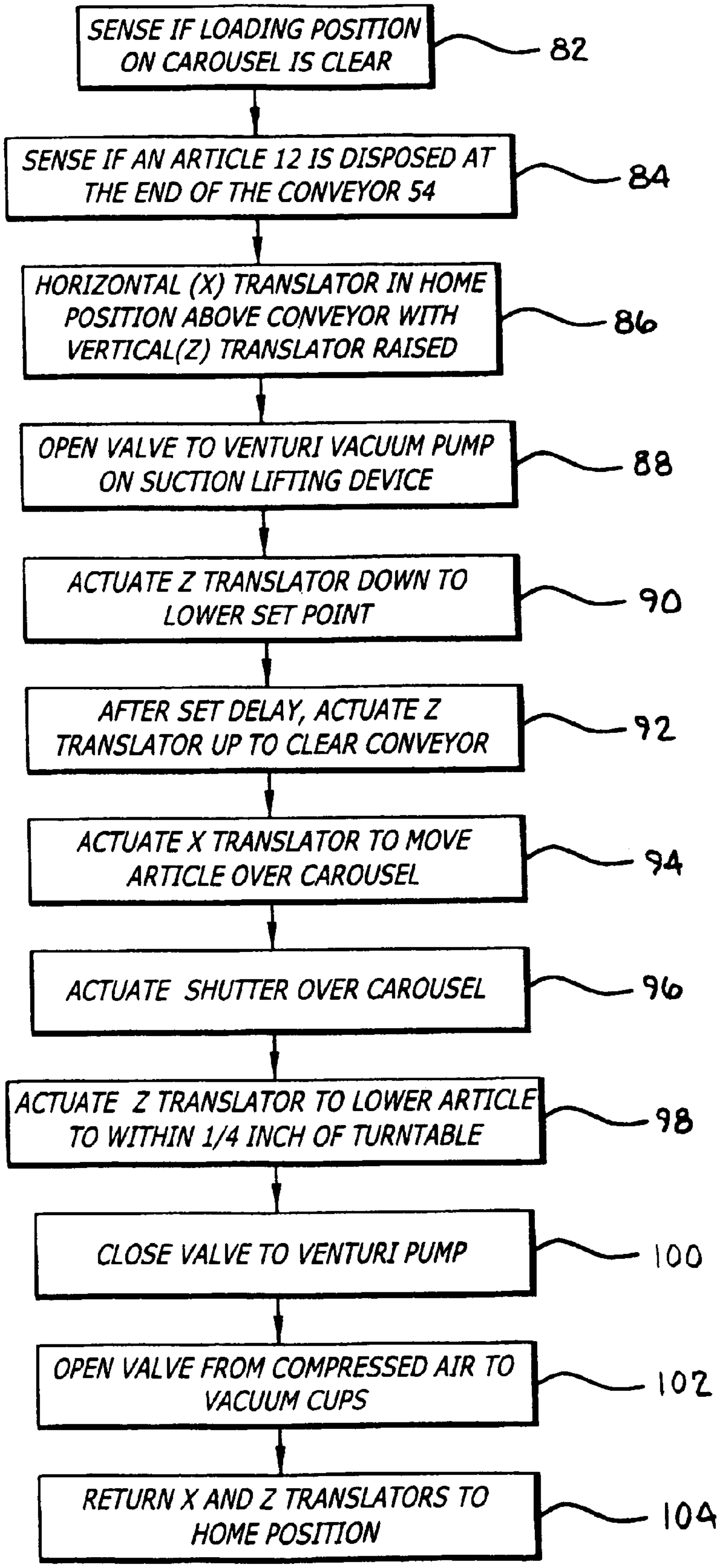
FIG. 12 is a flow chart showing the sequence of steps in transferring an article from a first conveyor into one of the compartments in the carousel.

FIG. 12 is a flow chart of the successive steps in transferring one of the articles 12 from the conveyor 54 to the individual one of the compartments 26 and for concurrently opening the closure member 78 in the compartment. As a first step in the process as indicated at 82, the compartment 26 in the carousel 14 is sensed to determine if the compartment is clear so that an article 12 can be disposed in the compartment. If the answer is yes, the position of an article 12 is sensed on the conveyor 54 to determine if the article is properly positioned to be transferred from the conveyor to the empty compartment 26 in the carousel 14. This is indicated at 84 in FIG. 12. For example, the position of the article 12 may be sensed to determine if it is at the end of the conveyor 54.

If the article is disposed at a particular position such as the end of the conveyor 54, a determination is made as at 86 that the horizontal translator 60 is disposed in a home position above the conveyor 54 with the vertical translator 66 raised. A valve (not shown) in the vacuum source 74 is then opened (see 88) to provide for a vacuum in the suction cups 72. The vertical translator 66 is thereafter moved downwardly (see 90) to a position for grasping the article 12 in the conveyor 54. After a pre-set delay, the vertical translator 66 is moved upwardly to a position where the horizontal translator 60 can move horizontally without interference from the conveyor 54. This is indicated at 92 in FIG. 12.

The horizontal translator 60 is then actuated to move to a position above the carousel 14 as indicated at 94 in FIG. 12. The closure member or shutter 78 for the pre-selected one of the compartments 26 is thereafter moved (see 96 in FIG. 12) to the open position so that the article 12 can be moved into the pre-selected one of the compartments 26. The vertical translator 66 is then moved downwardly, as indicated at 98, to a particular position such as approximately ¼ inch above the bottom wall of the conveyor 54. The valve in the vacuum pump 74 (which may be a venturi vacuum pump) is then closed, as indicated at 100, to discontinue the operation of the pump and the vacuum cups 72 are operated, as indicated at 102, to eliminate the vacuum in the cups and to impose a compression on the article. The article 12 then becomes disposed on the floor of the carousel 14. The vertical translator 66 and the horizontal translator 60 are then operated sequentially to return the vacuum cups 72 to a home position above the conveyor 54.

It will be appreciated that the carousel 14 is rotating at a substantially constant speed during the time that the successive steps shown in FIG. 12 and described above take place. The synchronization between the operation of these successive steps and the rotational positions of the carousel is provided by the microprocessor 64. For example, the vertical translator 66 is lowered at a time to deposit the article 12 in the preselected one of the compartments 26 in the carousel 14.

The transfer mechanism 52 in FIGS. 5 and 6 is constructed in a manner similar to the construction of the transfer mechanism 50. The transfer mechanism 52 includes a beam 104, a horizontal translator 106, a motor 108 for moving the translator 106 horizontally, a vertical translator 112, a motor 114 for moving the translator 112 vertically, a block 116, vacuum cups 118 and the vacuum source 74. The transfer mechanism 52 provides a transfer of the articles 12 from the compartments 26 in the carousel to a conveyor 120 in the unloading area 42 after radiant energy has been applied to the articles. The transfer of the articles 12 from the compartments 26 in the carousel to the conveyor 120 in the unloading area 42 is synchronized by, and under the control of, the microprocessor 64.

Figure 13:
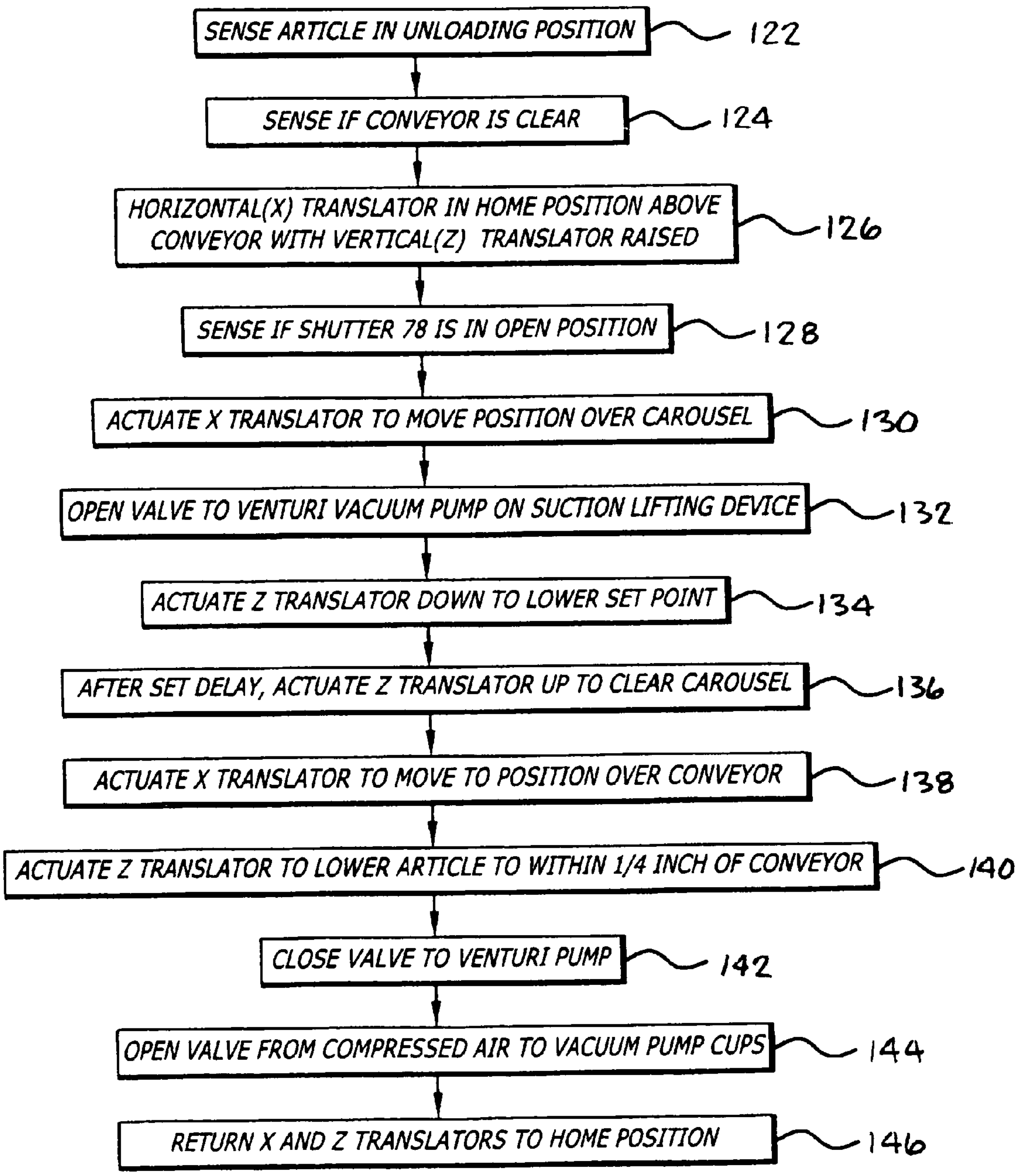
FIG. 13 is a flow chart showing the sequence of steps in transferring an article from a compartment in the carousel to a second conveyor after radiant energy has been applied to the article.

FIG. 13 shows a flow chart similar to that shown in FIG. 12. However, the flow chart shown in FIG. 13 is for the transfer of articles 12 from the carousel 14 to the unloading area 42 where a conveyor 120 is located. The steps in FIG. 13 are performed after the article 12 in an individual one of the carousel compartments 26 has received radiant energy. As a first step indicated at 122, the individual one of the carousel compartments 26 is sensed to determine if one of the articles 12 is in the compartment. If the answer is yes, the conveyor 120 is sensed, as at 124, to determine if the conveyor is clear of any articles 12. If the answer is yes, a determination is made, as at 126, as to whether the horizontal translator 60 is above the conveyor 120 and as to whether the vertical translator 66 is raised above the conveyor. Upon the occurrence of a yes answer, a determination (see 128) is made as to whether the closure member or shutter 78 in the individual one of the carousel compartments is in the open position.

The horizontal translator 106 is then actuated (see 130) for movement to a position above the carousel 14. The valve in the vacuum source or pump 74 is then opened as at 132 to apply a vacuum to the vacuum cups 72. The vertical translator 134 is then moved downwardly to grasp the article 14 in the individual one of the carousel compartments 26. After a pre-selected delay, the vertical translator 134 is moved upwardly through a sufficient distance to clear the carousel 14. This is indicated at 136. The horizontal translator 116 is thereafter moved to a position above the conveyor 120 (see 138).

The vertical translator 70 is subsequently lowered (see 140) to a position where the vacuum cups are within a suitable distance (e.g. ¼ inch) above the floor of the carousel 14. The valve in the vacuum source or pump 74 is then closed, as indicated at 142, to discontinue the vacuum in the vacuum source or pump 74. The valve in the vacuum source or pump 74 is then opened (see 144) to apply compressed air to the vacuum cups 72 to insure that the articles 12 move downwardly to the support surface of the conveyor 120. The horizontal translator 60 and the vertical translator 66 are then returned to their home positions above the conveyor 120. This is indicated at 146 in FIG. 12.

It is desirable to know the position of each article 12 in the individual one of the carousel compartments 26 in which the article is disposed. It is desirable to know the position of the article in the individual one of the compartments so that the microprocessor 64 can coordinate the movement of the translators 106 and 112 with the rotation of the carousel at the substantially constant speed, thereby assuring that the article will be transferred properly from the carousel compartment 26 to the conveyor 120. The apparatus shown in FIGS. 10 and 11 determines the position of each article 12 in the individual one of the carousel compartments 26.

Figure 10:
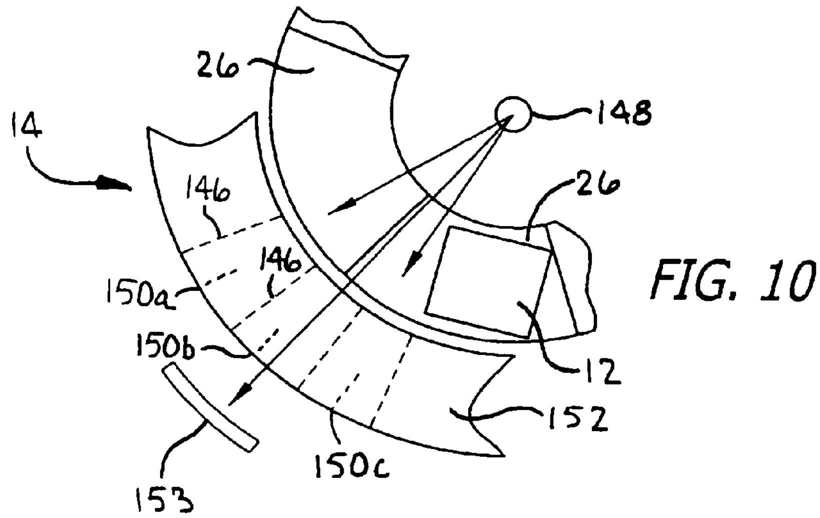
FIG. 10 is a fragmentary schematic plan view of a control system for sensing the position of an article in a compartment so as to provide for a proper operation of the apparatus shown in FIGS. 5 and 6 for removing articles from one of the compartments in the carousel.
Figure 11:
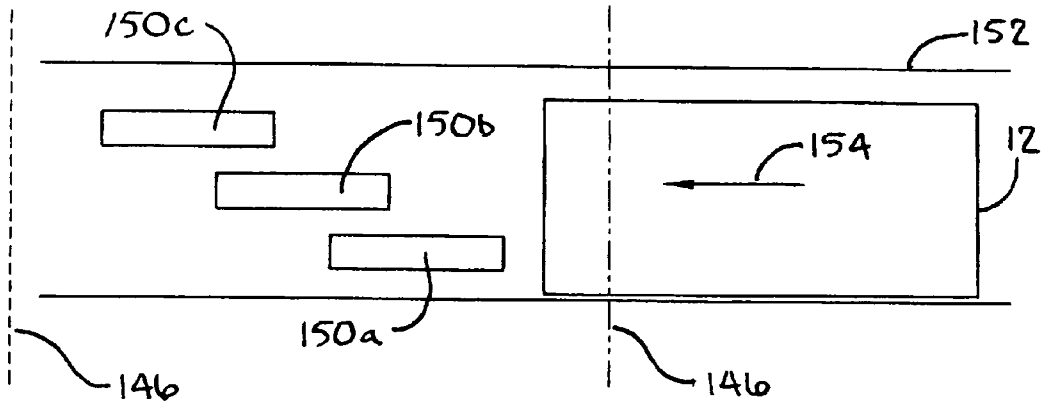
FIG. 11 is an enlarged fragmentary elevational view of an article and members included in the control system shown in FIG. 10 for sensing the position of the leading edge of the article in the compartment during the rotation of the carousel.

FIG. 10 is a fragmentary top plan view of the carousel 14 and shows a plurality of successive compartments 26 which are indicated by broken lines 146 as being separated from one another. An energy source (e.g., light source 148) is shown on one side of the carousel as shining light into and through the carousel. A plurality of apertures 150*a*, 150*b* and 150*c* (FIG. 11) are disposed on the opposite side of the carousel at progressive vertical positions in a member 152 displaced from the carousel. This is schematically shown in FIG. 11. The apertures 150*a*, 150*b* and 150*c* are progressively staggered from one another in the direction of rotational movement of the carousel. This direction of rotational movement is indicated at 154 in FIG. 11. Although three (3) apertures are shown in FIG. 11, it will be appreciated that any number of apertures, preferably at least two (2), may be provided in the member 152. A sensing member 153 is disposed on the opposite side of the carousel from the energy source such as the light source 148.

The carousel 14 is shown in the enlarged elevational view of FIG. 11 by an arrow 154 as rotating in a counterclockwise direction. One of the articles 12 is shown in FIGS. 10 and 11 as being disposed in one of the compartments 26 in the carousel 14. As will be seen from FIG. 11, the article 12 is positioned as progressively blocking light from the light source 148 so that the light is not able to pass through the apertures 150*a*, 150*b* and 150*c* to a sensor 156. The member 152 and the sensor 156 are shown in FIG. 10 as having an arcuate length corresponding to the arcuate length of one of the compartments 26. When the article 12 completely blocks the passage of light through all of the apertures 150*a*, 150*b* and 150*c*, the sensor 156 provides an indication of the position of the article 12 in the compartment. The microprocessor 64 then uses this indication to synchronize the movements of the horizontal translator 106 and the vertical translator 112 (see FIG. 13) with the rotational position of the article 14 in the individual one of the compartments 26 as shown in FIG. 11. As will be appreciated, the inclusion of more than one (1) of the apertures 50 in the staggered relationship provides for an enhanced sensitivity in the determination of the position of the article in the compartment.

Figure 14:
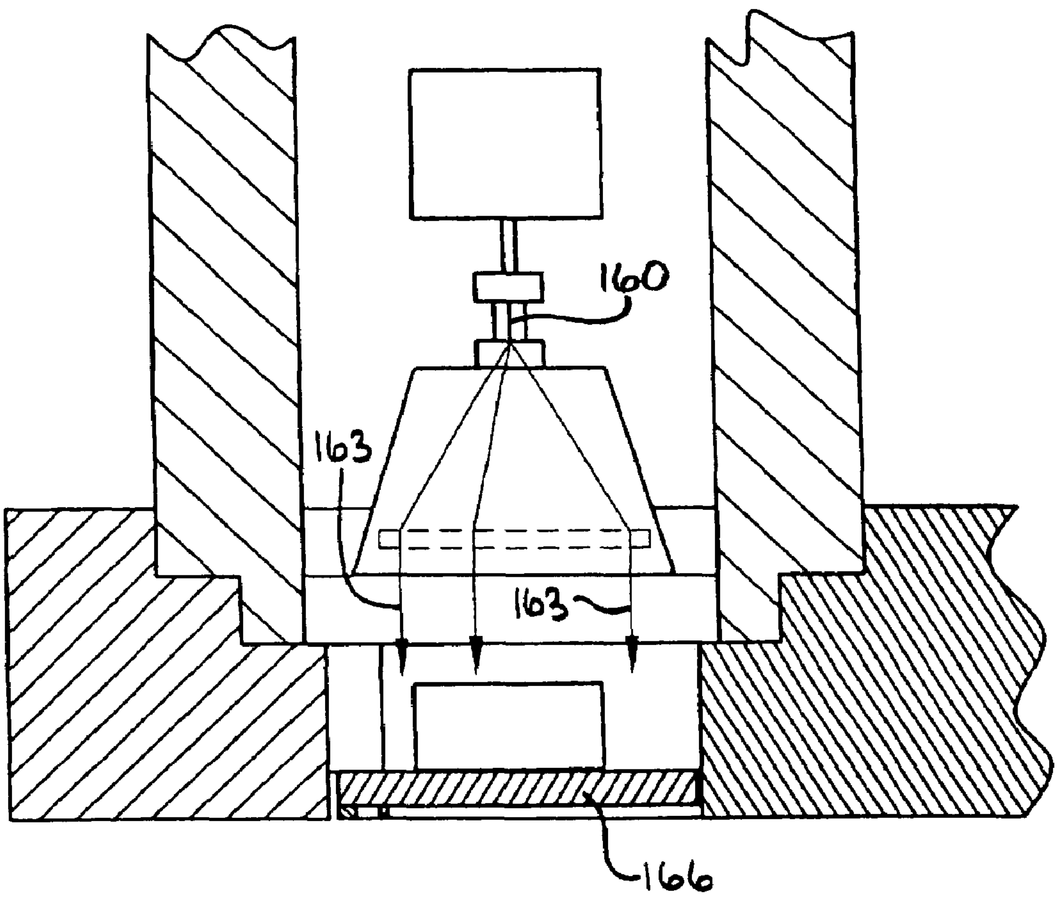
FIG. 14 is a simplified elevational view of the accelerator and shows a scan magnet in the accelerator for receiving a saw tooth voltage which causes an electron beam to be scanned in a direction substantially perpendicular to the direction of movement of the carousel and the direction of the electron beam.

The accelerator 22 is standard and is well known in the art. It provides a beam of electrons which flow downwardly in FIG. 1. It includes a scan magnet 160 which is shown in FIG. 14 and which provides for a scan of the beam in a direction extending into and out of the plane of the paper as the carousel 14 rotates in the direction 154 in FIG. 13. This scan is shown at 161 in FIG. 14 as being to the left and right in that Figure. This scan is provided by applying a cyclic voltage progressively increasing as at 162 to a particular magnitude 164 in a sawtooth waveform in FIGS. 7A and 9A, then decreasing instantaneously to zero and then progressively increasing in the sawtooth waveform 162 to the particular magnitude 164. The scan magnet 160 bends the electron beam into and out of the plane of the paper in FIG. 13 and to the left and right in FIG. 14 at each instant through an angle dependent upon the magnitude of the voltage applied to the scan magnet at that instant. The accelerator 22 also includes a bar magnet 166 (FIG. 14) which adjusts the angle of the electron beam so that the electron beam extends vertically downward in FIG. 1.

The rotational speed of the carousel 14 may be sensed at each instant and the speed may be adjusted in a servo loop so that the speed remains substantially constant. Furthermore, the magnitude of the voltage applied to the scan magnet 160 increases linearly in each cycle at a substantially constant rate. In this way, the position at each instant of the radiant energy beam in the scan direction may be precisely determined.

Figure 7:
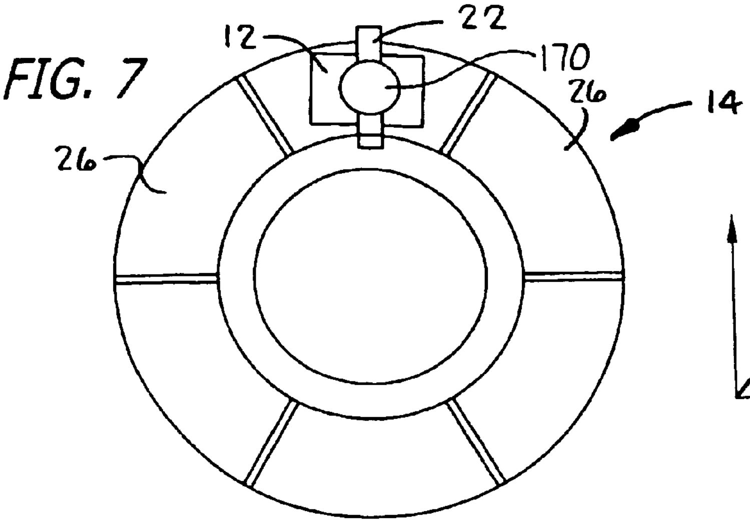
FIG. 7 is a schematic top plan view showing the disposition of an article in the carousel relative to the accelerator upon the occurrence of a fault.
Figure 9:
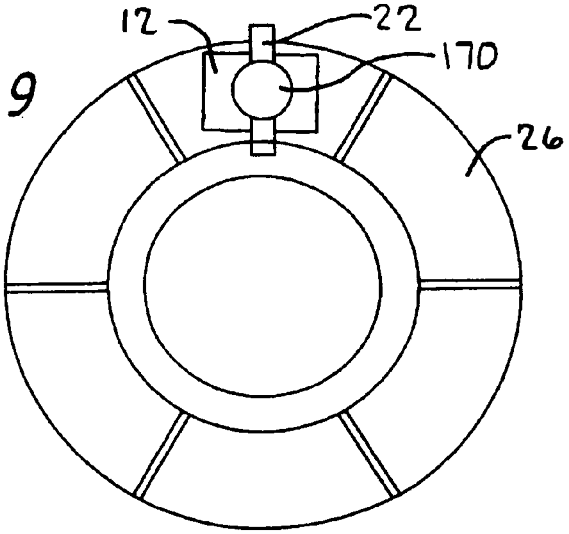
FIG. 9 is a schematic top plan view similar to that shown in FIGS. 7 and 8 and shows the disposition of the article in the carousel after the fault has been resolved and the carousel has been moved to the position corresponding in FIG. 7 to the position where the fault has occurred.

At some time, a fault may occur in the operation of the system shown in the drawings and described above. For example, one of the motors 62, 68, 80, 108 and 114 in the system (FIG. 6) may become completely or partially inoperative or the valve in the vacuum source 74 may become stuck. When a fault occurs, the operation of the accelerator 22 is discontinued and the rotary movement of the carousel 14 is simultaneously discontinued. A record is provided in the microprocessor 64 of the position of the carousel 14 relative to the accelerator 22 in the direction 154 in FIG. 11 at the occurrence of the fault. A record is also provided in the microprocessor 64 of the magnitude of the voltage introduced to the scan magnet 160 at the occurrence of the fault. This voltage magnitude is illustratively shown at 168 in FIG. 7A. The fault is schematically illustrated at 170 in FIGS. 7 and 9. The magnitude of the voltage applied to the scan magnet 160 at the time of the fault is indicated at 168 in FIGS. 7A and 9A.

After a slight delay to make certain that the movement of the carousel 14 in the direction 154 in FIG. 11 has stopped and that the accelerator 22 is not operative, the direction of rotation of the carousel 14 is reversed from the direction 154 shown in FIG. 11. The article 12 is then moved in a reverse direction (clockwise in FIG. 8) to a position indicated in broken lines at 12 in FIG. 8. As will be seen, the article 12 is now displaced from the fault 166 by a distance in a direction opposite to the normal direction 154 of movement of the article with the carousel. This distance is sufficiently great that the carousel can be accelerated to reach the substantially constant speed in the forward (counterclockwise in FIGS. 7–9) direction before the article reaches the position 170 of the fault. When the carousel 14 moves in the reverse (clockwise in FIG. 8) direction, it generates a voltage 174 which extends progressively on a cyclic basis from the particular magnitude 164 to a zero magnitude and then rises instantaneously to the particular magnitude for another progressive decrease to a zero (0) value.

Figure 7A:
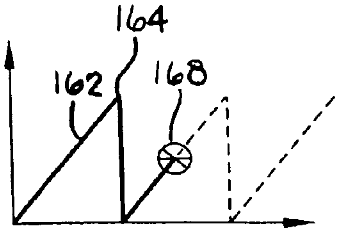
FIG. 7A shows the voltage applied to a scanner in the accelerator at the time that the fault occurs.
Figure 9A:
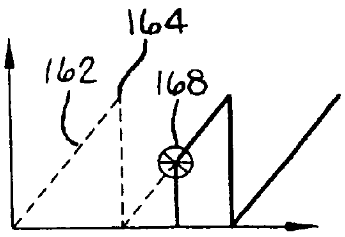
FIG. 9A additionally shows the voltage applied to the scanner at the instant that the accelerator again becomes activated after the fault has been resolved.

When the fault has become positively resolved so that the system shown in the drawings and described above is again fully operative, the generation of the voltage 162 in FIG. 7A is restored and rotational movement of the carousel 14 in the direction 154 (FIG. 11) is resumed. This is shown in FIG. 9A by the voltage wave form 162 in broken lines until the particular magnitude 164 is provided after the clearance of the fault. The carousel 14 is accelerated in the direction 154 (FIG. 11) to reach the substantially constant speed before the carousel reaches the fault position 170. When the magnitude of the generated voltage reaches the level 168 in FIG. 9A, the voltage is applied to the scan magnet 160. In this way, the scanning in the direction into and out of the plane of the paper in FIG. 11 is resumed at the position where the scan was interrupted at the occurrence of the fault. A substantially constant voltage is accordingly applied to the article 12 at every position in the article even though a fault has occurred during the movement of the article on the carousel.

Figure 15:
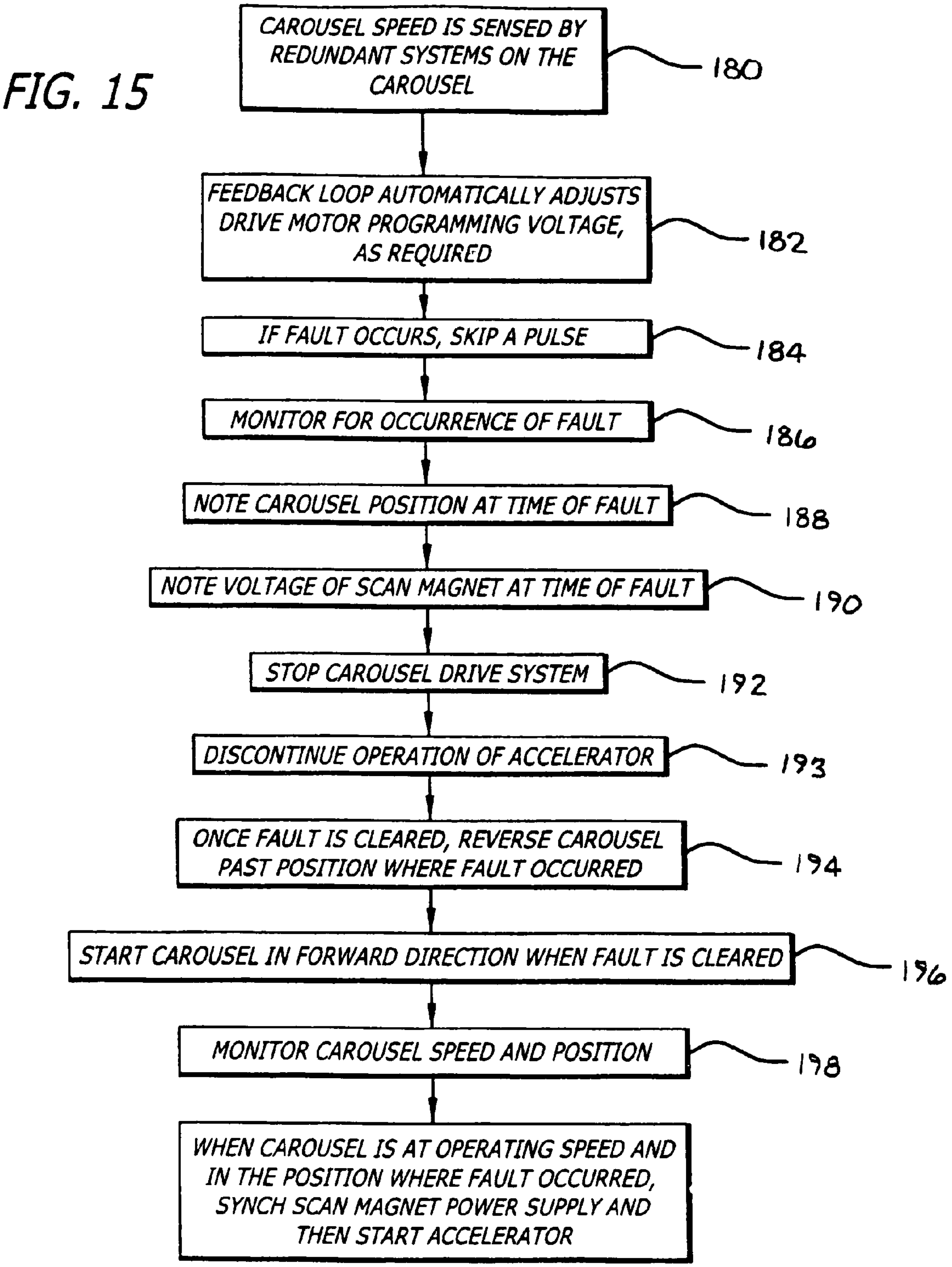
FIG. 15 is a flow chart showing the sequence of steps in interrupting the operation of the accelerator and the carousel upon the occurrence of a fault and in resuming the operation of the accelerator and the carousel, at the same position on the article as the position on the article upon the occurrence of the fault, after the resolution of the fault and the movement of the accelerator to that position.

FIG. 15 is a flow chart showing the operation of the system 10 when a fault occurs. As a first step during the normal operation of the carousel 14, the speed of the carousel is sensed by redundant systems on the carousel 14. This is indicated at 180 in FIG. 14. As shown at 182 in FIG. 15, a feedback loop in the system 10 automatically adjusts the voltage of the stepping motor 20 to a substantially constant magnitude so that the carousel rotates at a substantially constant speed. If and when a fault such as 170 occurs, a pulse is skipped (see 184) to provide time for the carousel 14 to stop and the accelerator 22 to become de-energized. The fault is detected by monitoring the system 10 for the occurrence of the fault as indicated at 186.

Figure 8:
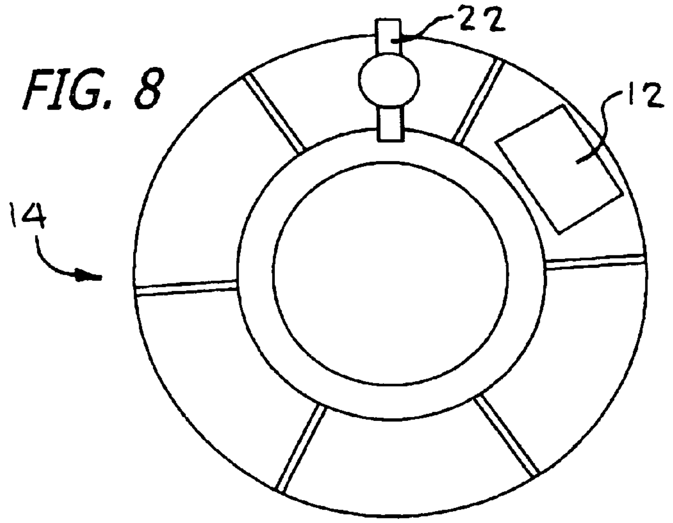
FIG. 8 is a schematic top plan view similar to that shown in FIG. 7 and shows the disposition of the article in the conveyor relative to the accelerator after the fault has occurred and the carousel has been reversed in position from the position shown in FIG. 7.
Figure 8A:
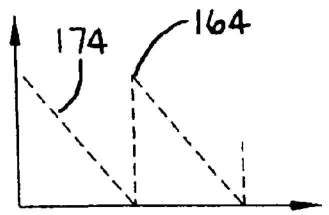
FIG. 8A shows the voltage applied to the accelerator scanner during a reverse movement of the accelerator from the position of the fault.

After the pulse is skipped, the position of the carousel 14 is determined at the time of the fault (see 188). This may be accomplished by providing a start position for the carousel rotation and by counting the number of steps taken by the stepping motor from the start position. The voltage applied to the scan magnet 160 at the time of occurrence of the fault is also determined as indicated at 190. The movement of the carousel 14 is stopped as indicated at 192, and the operation of the accelerator 122 is also discontinued at the occurrence of the fault as indicated at 193. The carousel is then reversed in direction as shown in FIG. 8 and at 194 in FIG. 15 and the carousel 14 is moved through a particular distance. This distance provides for a subsequent movement of the carousel in a forward direction (154 in FIG. 11) at the substantially constant speed past the position at which the fault occurred. The movement of the carousel 14 in the reverse direction is indicated in FIGS. 8A and 8B.

When the fault is cleared or resolved, the rotational direction of the carousel 14 is again reversed so that the carousel now moves in the forward direction 154 in FIG. 11. The carousel 14 is then accelerated to the substantially constant speed in the forward direction 154. This speed is monitored as indicated at 182 and 198 so that the carousel is rotating at the substantially constant speed when the carousel reaches the position where the fault occurred. At this time, the power supply for the scan magnet 160 is set at the same voltage that the power supply had when the fault occurred. This voltage is indicated at 168 in FIGS. 7A and 9A. The accelerator 22 is then energized to apply radiant energy to the article 12. In this way, the article 12 is provided with radiant energy of a particular magnitude at every position just as if no fault has occurred.

Although this invention has been disclosed and illustrated with reference to particular embodiments, the principles involved are susceptible for use in numerous other embodiments which will be apparent to persons of ordinary skill in the art. The invention is, therefore, to be limited only as indicated by the scope of the appended claims.

The invention claimed is:

1. A system for applying radiant energy to articles, a carousel having a hollow configuration and movable continuously in a loop at a substantially constant speed, the carousel defining compartments for holding the articles for movement with the carousel, an accelerator disposed relative to the carousel to provide radiant energy to the articles in the carousel during the movement of the carousel continuously at the substantially constant speed in the closed loop, a first member disposed within the hollow configuration of the carousel and having the configuration of the loop and having properties of shielding against the radiant energy from the accelerator, a second member disposed externally of the carousel and having the configuration of the loop and having properties of shielding against the radiant energy from the accelerator, a motor for driving the carousel in a first direction, and a control system for detecting a fault, for stopping the motor upon the detection of the fault, for reversing the motor after the stoppage of the motor and for resuming the operation of the motor in the first direction upon a clearing of the fault.

2. The system of claim 1, wherein:

the motor is operative to drive the carousel at a substantially constant speed in the first direction in the closed loop, the control system is operative to detect the position of the carousel upon the occurrence of the fault, and the control system is responsive to the detection of the fault for interrupting the operation of the accelerator and being responsive to a resumption in the movement of the carousel at the substantially constant speed in the first direction at the detected fault position for resuming the operation of the accelerator.

3. The system of claim 1, wherein the carousel, the first member and the second member are disposed on a common axis and wherein the beam is scanned in a second direction substantially perpendicular to the first direction and wherein the control system is operative to detect the position of the scan of the beam by the accelerator at the time of the occurrence of the fault and is operative to resume the scan of the beam at the detected scan position when the motor has moved the carousel in the first direction to the detected scan position.

4. The system of claim 2 wherein the control system is operative to reverse the direction of the motor from the first direction upon the occurrence of the fault and for resuming the operation of the motor in the first direction upon a clearance of the fault and for providing for an operation of the motor at the substantially constant speed in the first direction at the detected scan position.

5. The system of claim 4 wherein the carousel, the first member and the second member are disposed on a common axis and wherein the beam is scanned in a second direction substantially perpendicular to the first direction and wherein the control system is operative to detect the position of the scan by the accelerator at the time of the occurrence of the fault and is operative to resume the scan at the detected scan position when the motor has moved the carousel in the first direction to the detected scan position after the fault has been cleared.

6. A system for applying radiant energy to an article, comprising:

a carousel having a hollow configuration and movable in a loop, the carousel defining compartments for holding the articles for movement with the carousel, an accelerator disposed relative to the carousel to provide radiant energy to the articles in the carousel during the movement of the carousel in the loop, a first member disposed within the hollow configuration of the carousel and having the configuration of the loop and having properties of shielding against the radiant energy from the accelerator, a second member disposed externally of the carousel and having the configuration of the loop and having properties of shielding against the radiant energy from the accelerator, a motor for driving the carousel in the loop, and a control system responsive to the occurrence of a fault for interrupting the operation of the motor and the accelerator in providing for an irradiation of article in the carousel and for thereafter positioning the carousel to obtain a resumption of the irradiation of the article at the position in the article where the irradiation has been interrupted by the occurrence of the fault.

7. The system of claim 6 wherein the carousel, the first member and the second member arc disposed on a common axis and wherein the carousel, the first member and the second member are disposed in a common plane and wherein the motor is initially operated to move the carousel in a first direction until the occurrence of the fault and is then operated to reverse the direction of movement of the carousel and is subsequently operated to move the carousel in the first direction past the position of the fault after the fault has been cleared.

8. The system of claim 7 wherein the control system provides for an interruption in the operation of the accelerator upon the occurrence of the fault and provides for a resumption in the operation of the accelerator upon the clearance of the fault.

9. The system of claim 6, further comprising:

a first transfer mechanism disposed in a spaced relationship to the carousel for providing for a transfer of articles to the carousel for introduction of the radiant energy to the articles without interrupting the movement of the carousel, and a second transfer mechanism disposed in a spaced relationship to the carousel for providing for a transfer of the articles from the carousel after the provision of the radiant energy to the articles without interrupting the movement of the carousel.

10. The system of claim 6 wherein the control system detects the position of the carousel upon the occurrence of the fault and wherein the radiant energy from the accelerator is applied to the article until the occurrence of the fault and then remains interrupted during the reversal in the movement of the carousel after the occurrence of the fault and is subsequently provided, after the clearance of the fault, upon the movement of the carousel in the first direction at the substantially constant speed to the detected position of the carousel at the occurrence of the fault.

11. The system of claim 10, further comprising:

a loading area disposed in a spaced relationship to the carousel for providing for a transfer of articles to the carousel for introduction of radiant energy to the articles without interrupting the movement of the carousel, a first mechanism disposed in the loading area and controlled by the control system for transferring the articles from the loading area to the carousel, an unloading area disposed in a spaced relationship to the carousel and the loading area for providing for a transfer of the articles from the carousel after the provision of the radiant energy to the articles without interrupting the movement of the carousel, and a second carousel disposed in the unloading area and controlled by the control system for transferring the articles from the carousel to the unloading area after the irradiation of the articles.

* * * * *